US012635143B2

(12) United States Patent
Lin et al.

(10) Patent No.: US 12,635,143 B2
(45) Date of Patent: May 19, 2026

(54) THREE-DIMENSIONAL MEMORY DEVICE AND METHOD

(71) Applicant: Taiwan Semiconductor Manufacturing Co., Ltd., Hsinchu (TW)

(72) Inventors: Meng-Han Lin, Hsinchu (TW); Sai-Hooi Yeong, Zhubei City (TW); Chia-En Huang, Xinfeng Township (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 636 days.

(21) Appl. No.: 18/152,585

(22) Filed: Jan. 10, 2023

(65) Prior Publication Data

US 2024/0015976 A1 Jan. 11, 2024

Related U.S. Application Data

(60) Provisional application No. 63/409,126, filed on Sep. 22, 2022, provisional application No. 63/367,827, filed on Jul. 7, 2022.

(51) Int. Cl.
*H10D 64/00* (2025.01)
*H01L 23/528* (2006.01)
(Continued)

(52) U.S. Cl.
CPC ......... *H10B 51/20* (2023.02); *H01L 23/5283* (2013.01); *H10D 30/0415* (2025.01); *H10D 30/701* (2025.01); *H10D 64/689* (2025.01)

(58) Field of Classification Search
CPC ..... H10B 51/20; H10B 51/30; H01L 23/5283; H10D 30/0415; H10D 30/701; H10D 64/689

(Continued)

(56) References Cited

U.S. PATENT DOCUMENTS 4,757,361 A * 7/1988 Brodsky ............ H10D 30/6728
257/773
5,132,745 A * 7/1992 Kwasnick .......... H10D 30/0321
257/E21.414

(Continued)

FOREIGN PATENT DOCUMENTS

TW 305075 B 5/1997
TW 202205641 A 2/2022

*Primary Examiner* — Sheikh Maruf
(74) *Attorney, Agent, or Firm* — Slater Matsil, LLP

(57) ABSTRACT

In an embodiment, a device includes a first gate structure over a substrate, the first gate structure including a first gate electrode over a first side of a first gate dielectric; a first electrode and a second electrode disposed over a second side of the first gate dielectric opposite the first side; a second gate structure disposed between the first electrode and the second electrode, the second gate structure including a second gate electrode and a second gate dielectric, the second gate dielectric at least laterally surrounding the second gate electrode; and a semiconductor film disposed between the first electrode and the second electrode and at least laterally surrounding the second gate structure, wherein at least one of the first gate dielectric or the second gate dielectric is a memory film.

20 Claims, 17 Drawing Sheets

(51) Int. Cl.
    *H10B 51/20*     (2023.01)
    *H10D 30/01*     (2025.01)
    *H10D 30/69*     (2025.01)
    *H10D 64/68*     (2025.01)

(58) Field of Classification Search
    USPC ......................................................... 257/295
    See application file for complete search history.

(56)              References Cited

U.S. PATENT DOCUMENTS

| | | | |
|---|---|---|---|
| 6,376,312 B1 * | 4/2002 | Yu ........................ | H10D 86/201 |
| | | | 257/E29.302 |
| 6,528,845 B1 * | 3/2003 | Bude ...................... | H10D 30/69 |
| | | | 257/E27.081 |
| 10,403,631 B1 * | 9/2019 | Lu ...................... | H01L 21/76829 |
| 11,495,618 B2 | 11/2022 | Lin et al. | |
| 2004/0233724 A1 * | 11/2004 | Shibata .............. | H10D 30/6893 |
| | | | 257/E21.21 |
| 2011/0156132 A1 * | 6/2011 | Kiyotoshi .............. | H10B 43/27 |
| | | | 257/326 |
| 2012/0139039 A1 * | 6/2012 | Juengling ......... | H01L 21/26586 |
| | | | 257/330 |
| 2013/0100729 A1 * | 4/2013 | Wan .................... | H10D 30/711 |
| | | | 365/149 |
| 2015/0249143 A1 * | 9/2015 | Sano ................... | H10D 30/025 |
| | | | 257/66 |
| 2015/0255619 A1 * | 9/2015 | Shimabukuro .... | H10N 70/8825 |
| | | | 257/314 |
| 2020/0044095 A1 * | 2/2020 | Wang .................. | H10D 86/421 |
| 2022/0359529 A1 * | 11/2022 | Kao ....................... | H10B 12/37 |

* cited by examiner

THREE-DIMENSIONAL MEMORY DEVICE AND METHOD

PRIORITY CLAIM AND CROSS-REFERENCE

This application claims the benefit of U.S. Provisional Application No. 63/367,827, filed on Jul. 7, 2022, and U.S. Provisional Application No. 63/409,126, filed on Sep. 22, 2022, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
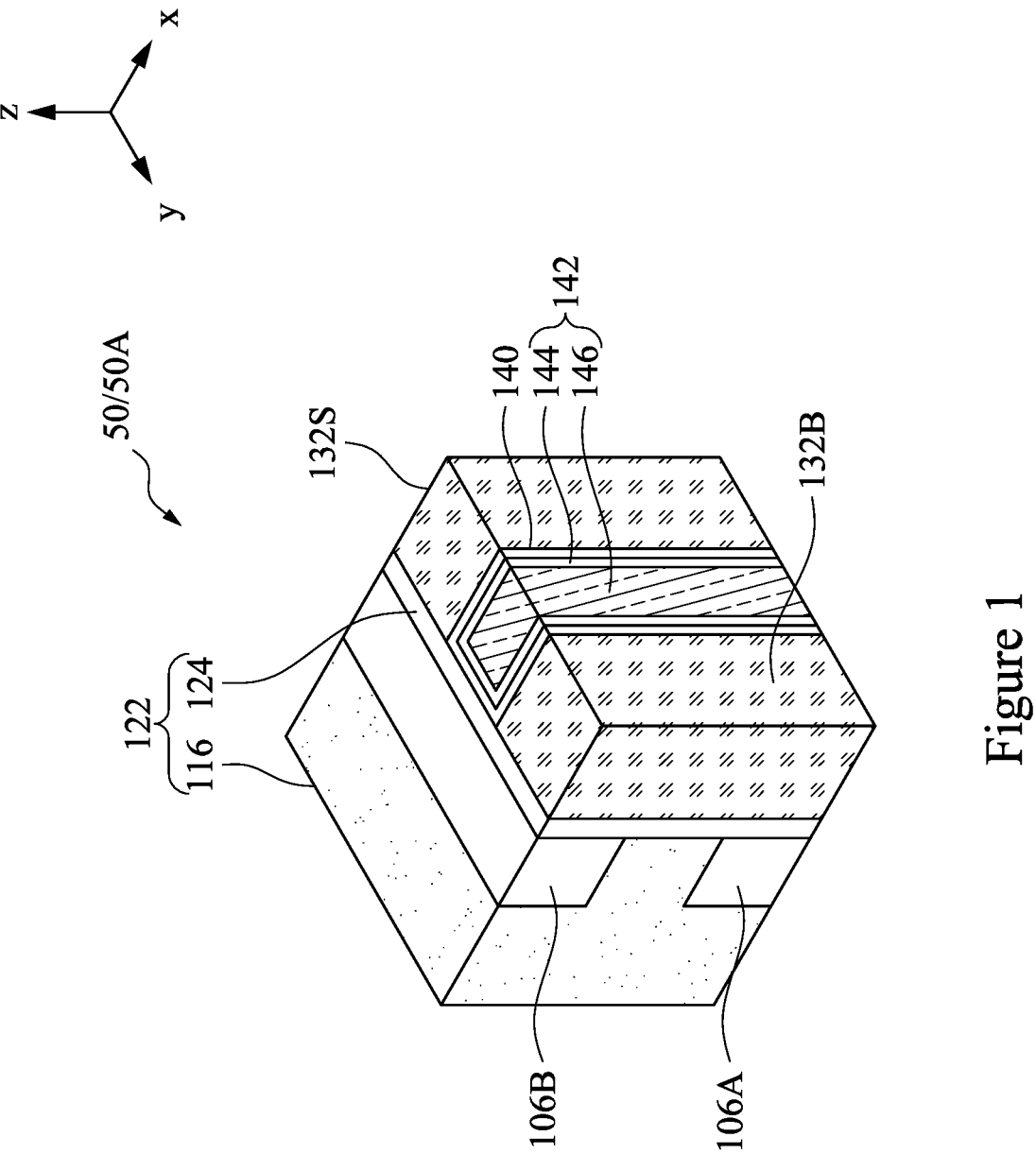
FIG. 1 illustrates an example of a memory cell, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory array with a plurality of memory cells. Each memory cell includes a vertical field-effect transistor (FET). Each vertical FET may have a first gate electrode provided by a word line and a second gate electrode provided by an assist gate, a first source/drain electrode provided by a bit line, and a second source/drain electrode provided by a source line. Each vertical FET further includes at least one memory film (e.g., as a gate dielectric), and a semiconductor channel region. The first gate electrode and the second gate electrode may be disposed over lateral sides of the memory film and semiconductor channel region.

FIG. 1 illustrates a memory cell 50 in a three-dimensional view, in accordance with some embodiments. A plurality of the memory cells 50 may form a memory array. The memory cell (or the memory array) may be disposed in an interconnect structure of a semiconductor die, which may be formed in a back end of line (BEOL) process. The memory cell 50 (or the memory array) may be disposed in interconnect layers of the semiconductor die, such as, above one or more active devices (e.g., transistors) formed on a semiconductor substrate.

The memory cell 50 may include a transistor 50A. The transistor 50A may be a vertical FET. The transistor 50A may include a first gate structure 122 (or alternatively referred to as select gate) and a second gate structure 142 (or alternatively referred to as assist gate or control gate). The first gate structure 122 may include a first gate electrode 116 and a first gate dielectric 124. The first gate electrode 116 may be, for example, disposed over a first side of the first gate dielectric 124 in the x-direction as illustrated in FIG. 1. The first gate electrode 116 may be provided (in part) by a portion of a word line. The first gate electrode 116 and the first gate dielectric 124 may extend in the y-direction as illustrated in FIG. 1. The second gate structure 142 may be, for example, disposed over a second side of the first gate dielectric 124 opposite the first side of the first gate dielectric 124. The second gate structure 142 may include a second gate electrode 146 at least laterally surrounded by a second gate dielectric 144.

A first source/drain electrode 132B and a second source/drain electrode 132S may be disposed over the second side of the first gate dielectric 124 and disposed over sidewalls of the second gate structure 142 in the y-direction. The first source/drain electrode 132B may be a part of or electrically coupled to a bit line, and the second source/drain electrode 132S may be a part of or electrically coupled to a source line. In some embodiments, the second source/drain electrode 132S (e.g., source line) is electrically coupled to ground. The first source/drain electrode 132B and the second source/drain electrode 132S may define boundaries of the memory cell 50. Although FIG. 1 illustrates a particular placement of the first source/drain electrode 132B relative to the second source/drain electrode 132S, it should be appreciated that the placement of the first source/drain electrode 132B and second source/drain electrode 132S may be flipped in some embodiments.

A semiconductor film 140 may be disposed between the first source/drain electrode 132B and the second source/drain electrode 132S and at least laterally surround the second gate structure 142. The semiconductor film 140 may provide a channel region of the transistor 50A of the memory cell 50. In some embodiments, the first gate electrode 116 has an extrusion extending between the first and second dielectric layers 106A and 106B. The extrusion may be adjacent to the semiconductor film 140. When appropriate voltages (e.g., higher than a respective threshold voltage $(V_{th})$ of the transistor 50A) are applied through the first gate structure 122 and the second gate structure 142, the semiconductor film 140 may allow current to flow from the first source/drain electrode 132B to the second source/drain electrode 132S, for example, in the y-direction as illustrated in FIG. 1. The transistor 50A is a vertical transistor. A channel width of the transistor 50A is in the z-direction, and the on-state current $I_{on}$ may be increased by increasing the thickness of the first gate electrode 116, thereby the performance of the memory cell 50 being able to be enhanced without increasing the footprint of the memory cell 50.

In some embodiments, at least one of the first gate dielectric 124 or the second gate dielectric 144 is a memory film, which may be capable of storing a bit. The memory film may be a ferroelectric film. In some embodiments the ferroelectric film is used, the memory cell 50 can be referred to as a ferroelectric random-access memory (FeRAM). Alternatively, the memory film may be a different type of memory material for forming other types of memory. The memory film of the memory cell 50 (e.g., the first gate dielectric 124 and/or the second gate dielectric 144) may be polarized in one of two different directions, and the polarization direction may be changed by applying an appropriate voltage differential across the memory film. Depending on a polarization direction of the memory film, a threshold voltage of the transistor varies, and a digital value (e.g., 0 or 1) can be stored. For example, when the memory film has a first electrical polarization direction, the transistor 50A may have a relatively low threshold voltage, and when the memory film has a second electrical polarization direction, the transistor 50A may have a relatively high threshold voltage. In some embodiments, the first gate structure 122 and the second gate structure 142 are independently provided with different voltages. The transistor 50A having such dual gate structure may provide more options for providing voltage differential across the memory film of the memory cell 50 than a transistor having a single gate structure.

FIGS. 2-10, 11A, and 12 are three-dimensional views of intermediate stages in the manufacturing of a memory array 100, in accordance with some embodiments. FIG. 11B illustrates a cross-sectional view along the cross-section A-A' in the X-direction of FIG. 11A. The cross-section A-A' extends through one of the first gate electrodes 116 and its adjacent second gate structures 142.

Figure 2:
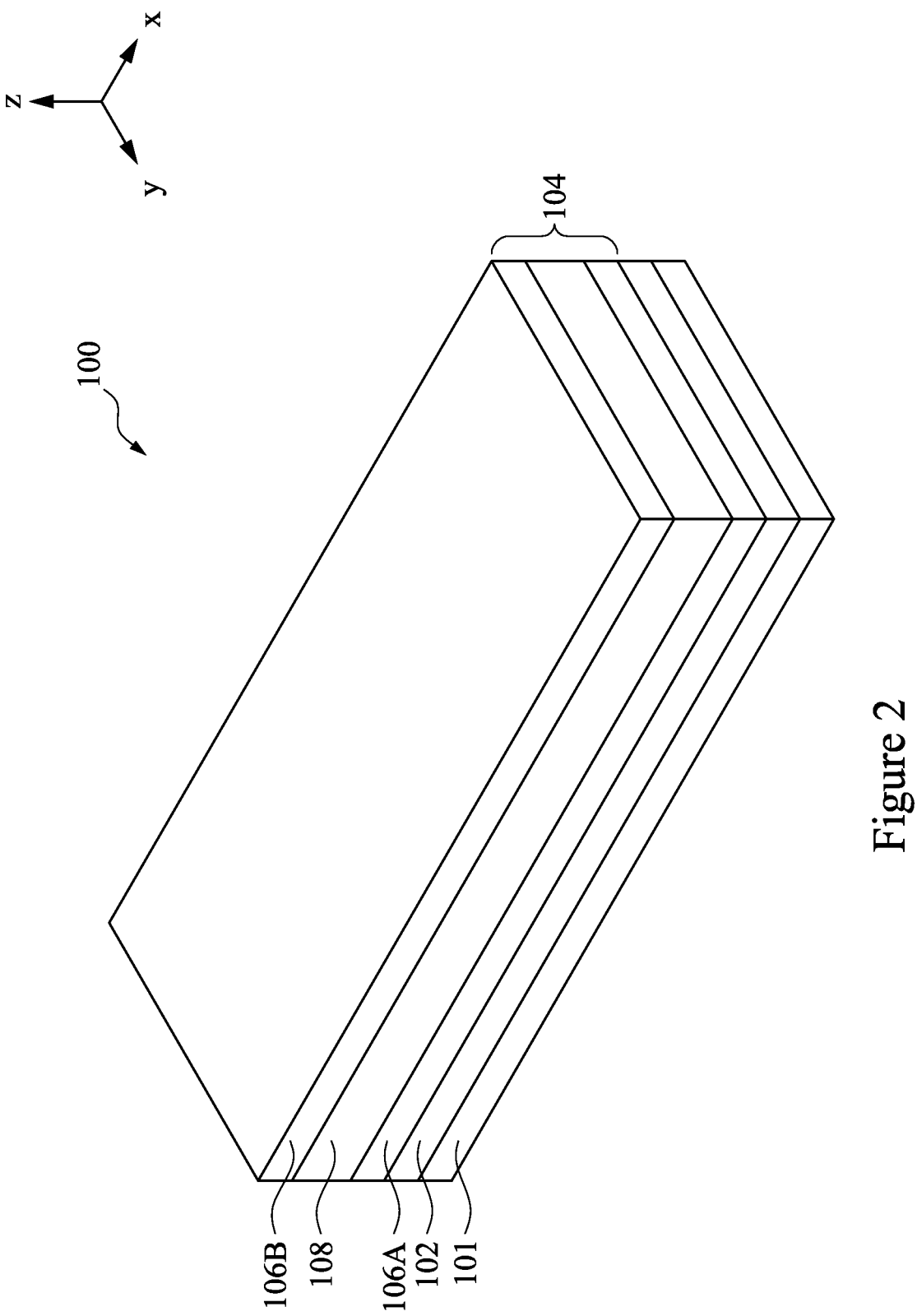
FIGS. 2-10, 11A, and 12 are 3-dimensional views of intermediate stages in the manufacturing of a memory array, in accordance with some embodiments.

In FIG. 2, a substrate 101 is provided. The substrate 101 may be formed over a substrate (not shown). The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be utilized. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Circuits (not shown) and an interconnect structure 102 may be formed over the substrate 101. The circuits include active devices (e.g., transistors) at a top surface of the substrate 101. The transistors may include channel regions, gate structures on the channel regions, and source/drain regions adjoining the channel regions. In some embodiments, the transistors may be planar field effect transistors (FETs), fin field effect transistors (finFETs), nano-field effect transistors (nano-FETs), or the like. Further, the circuits may also include other active devices (e.g., diodes or the like) and/or passive devices (e.g., capacitors, resistors, or the like). An inter-layer dielectric surrounds and isolates the active devices, such as source/drain regions and the gate structures, and the passive devices. An interconnect structure 102, including one or more stacked dielectric layers and interconnects formed in the one or more dielectric layers, is over the inter-layer dielectric. The interconnect structure 102 may include any number of dielectric layers having interconnects disposed therein. In some embodiments, the dielectric layers are low-k dielectrics. The interconnect structure 102 and the circuits over the substrate 101 may be electrically coupled to form functional circuits. In some embodiments, the functional circuits include logic circuits, memory circuits, sense amplifiers, controllers, input/output circuits, image sensor circuits, the like, or combinations thereof. In some embodiments, the interconnects of the interconnect structure 102 are patterned to provide power, ground, and/or signal lines for the active devices over the substrate 101.

A multi-layer stack 104 is formed over the substrate 101 and/or the interconnect structure 102, in accordance with some embodiments. The multi-layer stack 104 may include a first dielectric layer 106A, a second dielectric layer 106B, and a third dielectric layer 108 interposed between the first and second dielectric layers 106A and 106B. In some embodiments, the first and second dielectric layers 106A and 106B are formed of a first dielectric material, and the third dielectric layer 108 is formed of a second dielectric material. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Each layer of the multi-layer stack 104 may be formed by any acceptable deposition process such as chemical vapor deposition (CVD), atomic layer deposition (ALD), or the like. The first to third dielectric layers 106A, 106B, and 108 will be used to define shapes of first gate electrodes 116 (e.g., the word lines) for transistors 50A in subsequent processing. The second dielectric material of the third dielectric layer 108 has a high etching selectivity from the etching of the first dielectric material of the first and second dielectric layers 106A and 106B. In some embodiments, the first and second dielectric layers 106A and 106B are formed of silicon oxide, and the third dielectric layer 108 is formed of silicon nitride. Other combinations of dielectric materials having acceptable etching selectivity from one another may also be utilized. In the illustrated embodiment, the multi-layer stack 104 includes two dielectric layers formed of the first dielectric material and one dielectric layer formed of the second dielectric material. The multi-layer stack 104 may include other quantities of dielectric layers formed of various dielectric materials.

Figure 3:
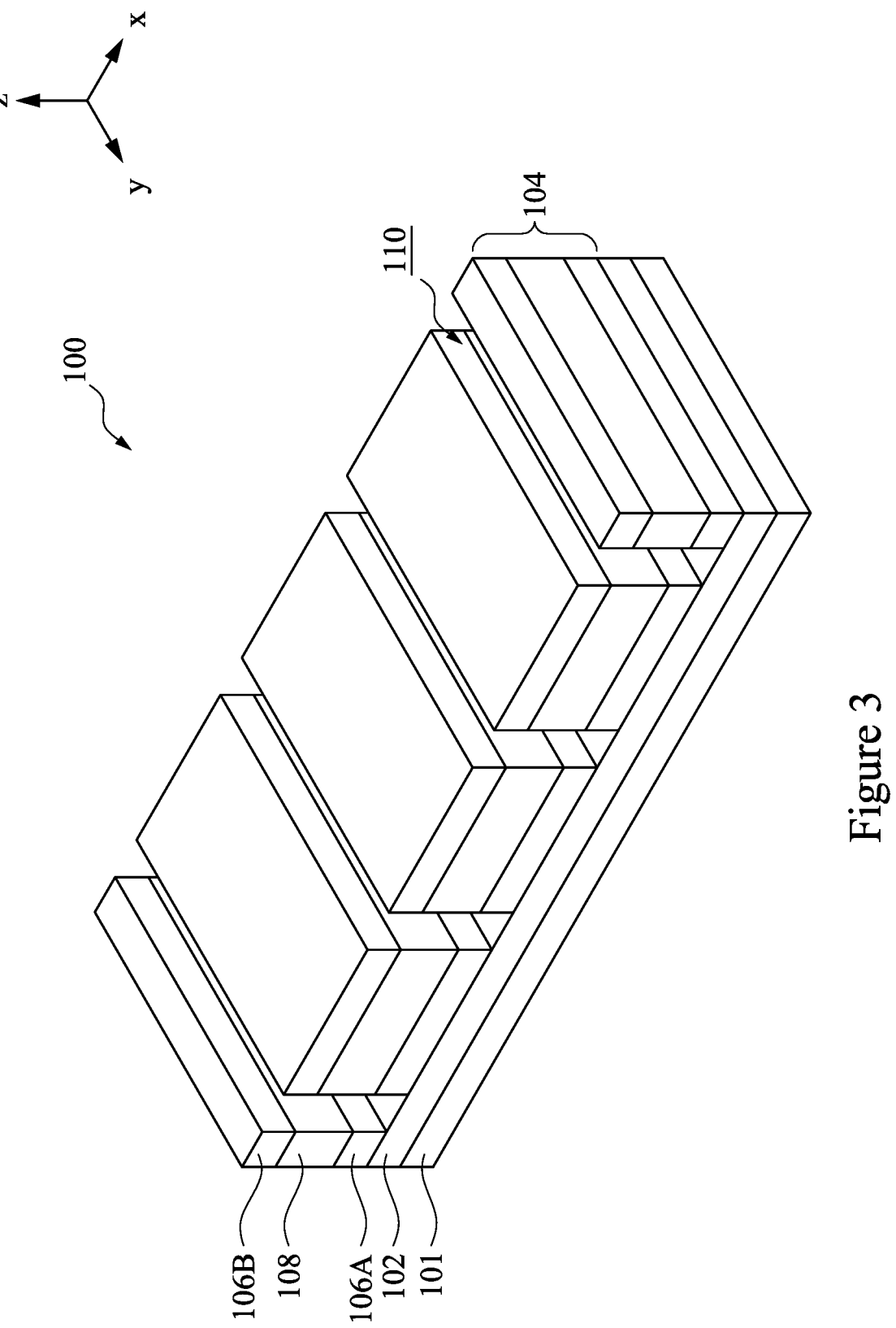

In FIG. 3, the multi-layer stack 104 is etched to form a plurality of trenches 110 in the multi-layer stack 104. The trenches 110 may extend through the multi-layer stack 104, such as exposing the underlying interconnect structure 102. The trenches 110 may extend in the y-direction. The etching may be any acceptable etch process. For example, a mask (not shown) is formed over the multi-layer stack 104. The mask may be formed of a photoresist, such as a single layer photoresist, a tri-layer photoresist, or the like, or a hard mask, such as TiN or other suitable mask materials other than the materials of the first to third dielectric layers 106A, 106B, and 108. The mask is then patterned to expose regions of the multi-layer stack 104 corresponding to the pattern of the trenches 110 while masking the remaining portions of the multi-layer stack 104. The etching also includes etching the exposed regions of the multi-layer stack 104 using a dry etch or a wet etch. For example, the dry etch may be a reactive ion etch (RIE), neutral beam etch (NBE), the like, or a combination thereof. The etching may be anisotropic. In some embodiments, the trenches 110 have a width of 5 nm to 1000 nm in the x-direction as illustrated in FIG. 3. The mask may be removed during or after the formation of the trenches 110.

Figure 4:
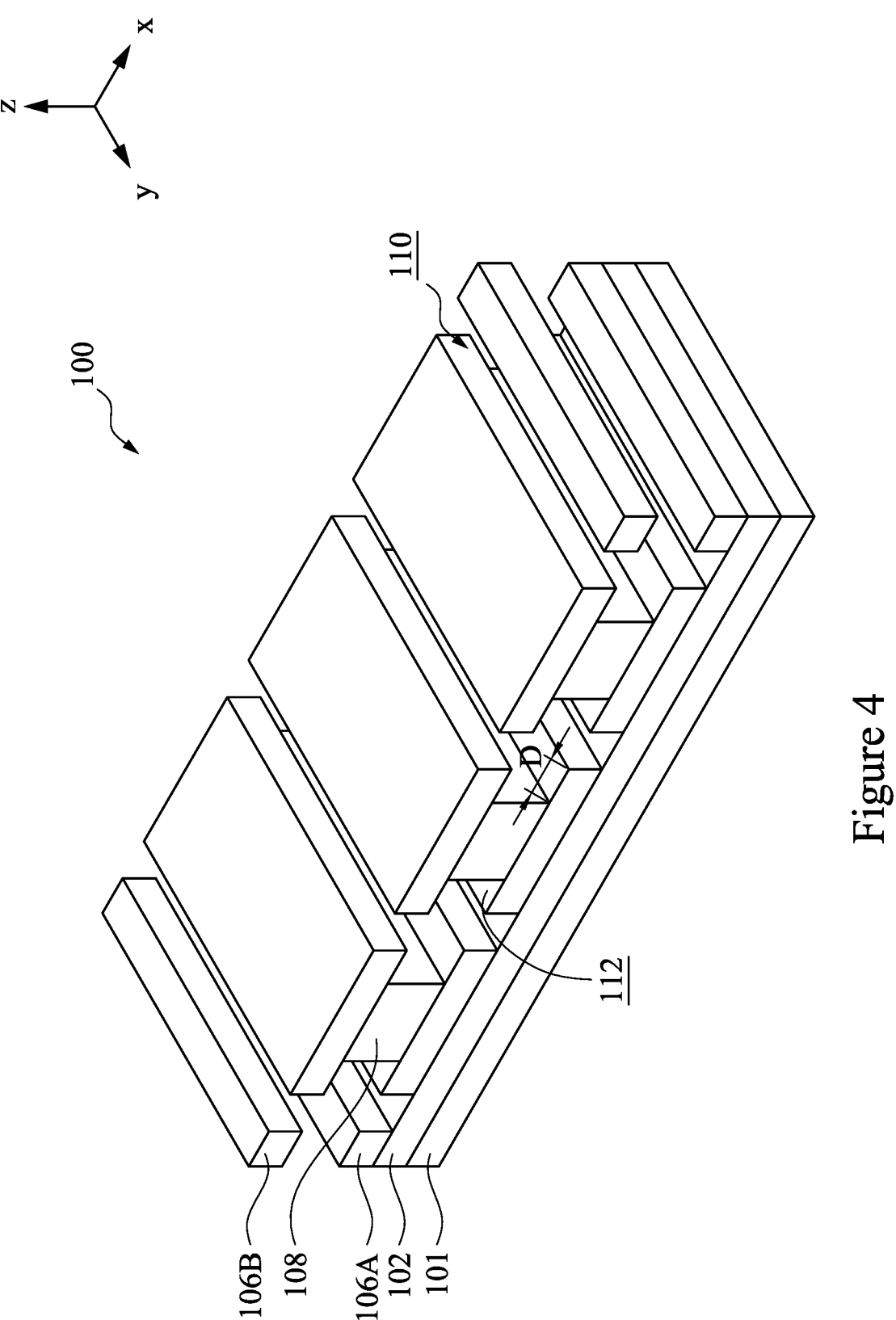

In FIG. 4, the third dielectric layer 108 is laterally etched from its sidewalls exposed from the trenches 110, thereby forming sidewall recesses 112 over sidewalls of the remaining portions of the third dielectric layer 108. The sidewall recesses 112 may be sandwiched between the first and second dielectric layers 106A and 106B. The third dielectric layer 108 may be etched by any acceptable process, such as a wet etch. The etching may be isotropic. The etchant of the wet etch may be one that is selective to the material(s) of the third dielectric layer 108 (e.g., selectively removes the material(s) of the third dielectric layer 108 at a faster rate than the material of the first and second dielectric layers 106A and 106B). In embodiments where the first and second dielectric layers 106A and 106B are formed of silicon oxide, and the third dielectric layer 108 is formed of silicon nitride, the third dielectric layer 108 can be removed by an etchant such as phosphoric acid ($H_3PO_4$). The sidewall recess 112 may have a depth D in the x-direction as illustrated in FIG. 4. The depth D of the sidewall recesses 112 may be adjusted by varying the etching time of the etching.

Figure 5:
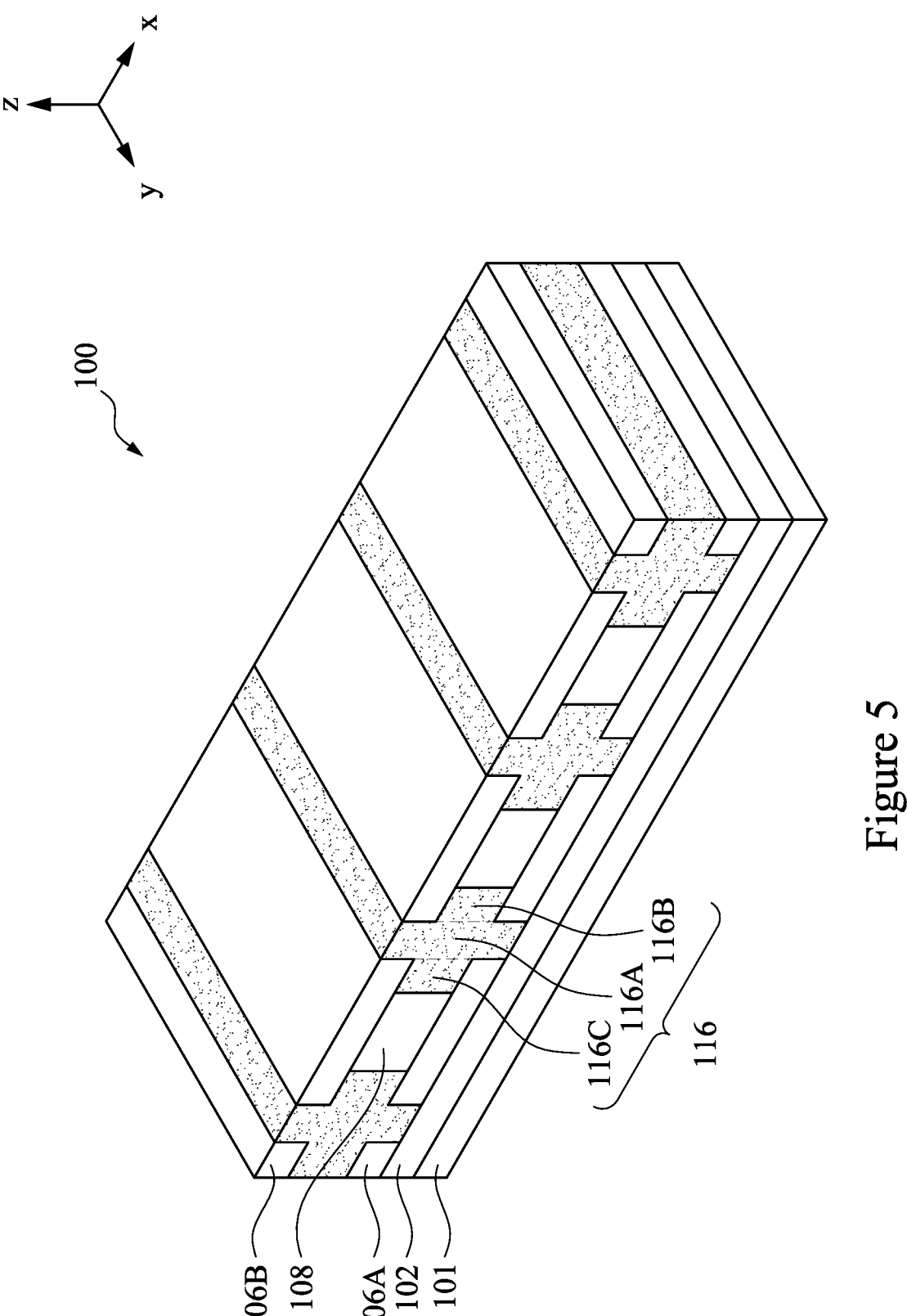

In FIG. 5, the first gate electrodes 116 for the memory array 100 are formed in the trenches 110 and the sidewall recesses 112, in accordance with some embodiments. The first gate electrodes 116 may be word lines for the memory array 100. The first gate electrodes 116 may each include one or more layers, such as seed layers, adhesion layers, diffusion barrier layers, fill layers, and the like. In some embodiments, the first gate electrodes 116 each include one or more liner layers, such as diffusion barrier layers, adhesion layers, or the like, and a main layer sandwiched between the liner layer. In some embodiments, the material of the liner layer is one that has good adhesion to the material of the first to third dielectric layers 106A, 106B, and 108, and the material of the main layer is one that has good adhesion to the material of the liner layer and also has a low resistivity. For example, the liner layer may be a metal nitride, such as titanium nitride, tantalum nitride, molybdenum nitride, zirconium nitride, hafnium nitride, or the like. The main layer may be a metal, such as tungsten, ruthenium, molybdenum, cobalt, aluminum, nickel, copper, silver, gold, alloys thereof, or the like. In some embodiments, the liner layer is formed of titanium nitride, and the main layer is formed of tungsten. The materials of the liner layer and the main layer may be formed by acceptable deposition processes such as chemical vapor deposition (CVD), atomic layer deposition (ALD), or the like. For example, the liner layer may be deposited in the trenches 110 and around the first to third dielectric layers 106A, 106B, and 108 using a conformal deposition process such as ALD, and the main layer may be subsequently deposited on the liner layers using a deposition process such as CVD or PVD. The thickness of the liner layer may be less than the thickness of the main layer. In some embodiments, excess material of the first gate electrodes 116, such as materials over the top surface of the second dielectric layer 106B, may be removed by a planarizing process, such as CMP, an etching-back process, or combinations thereof.

The material of the first gate electrodes 116 may fill the trenches 110 the sidewall recesses 112, and the first gate electrodes 116 may each have a cross shape, a cross-like shape, or the like, in a cross-sectional view in the x-direction. The first gate electrodes 116 may extend in the y-direction. For example, the first gate electrodes 116 may each include a first portion 116A, a second portion 116B, and a third portion 116C in the cross-sectional view in the x-direction. The first portion 116A may be sandwiched between and connected to the second portion 116B and the third portion 116C. The thickness of the first portion 116A (e.g., in the z-direction) may be different than the thicknesses of the second portion 116B and the third portion 116C, such as greater than the thicknesses of the second portion 116B and the third portion 116C. For example, the first portion 116A may have a thickness equal to the overall thickness of the multi-layer stack 104, and the second portion 116B and the third portion 116C may have a thickness equal to a thickness of the third dielectric layer 108.

Figure 6:
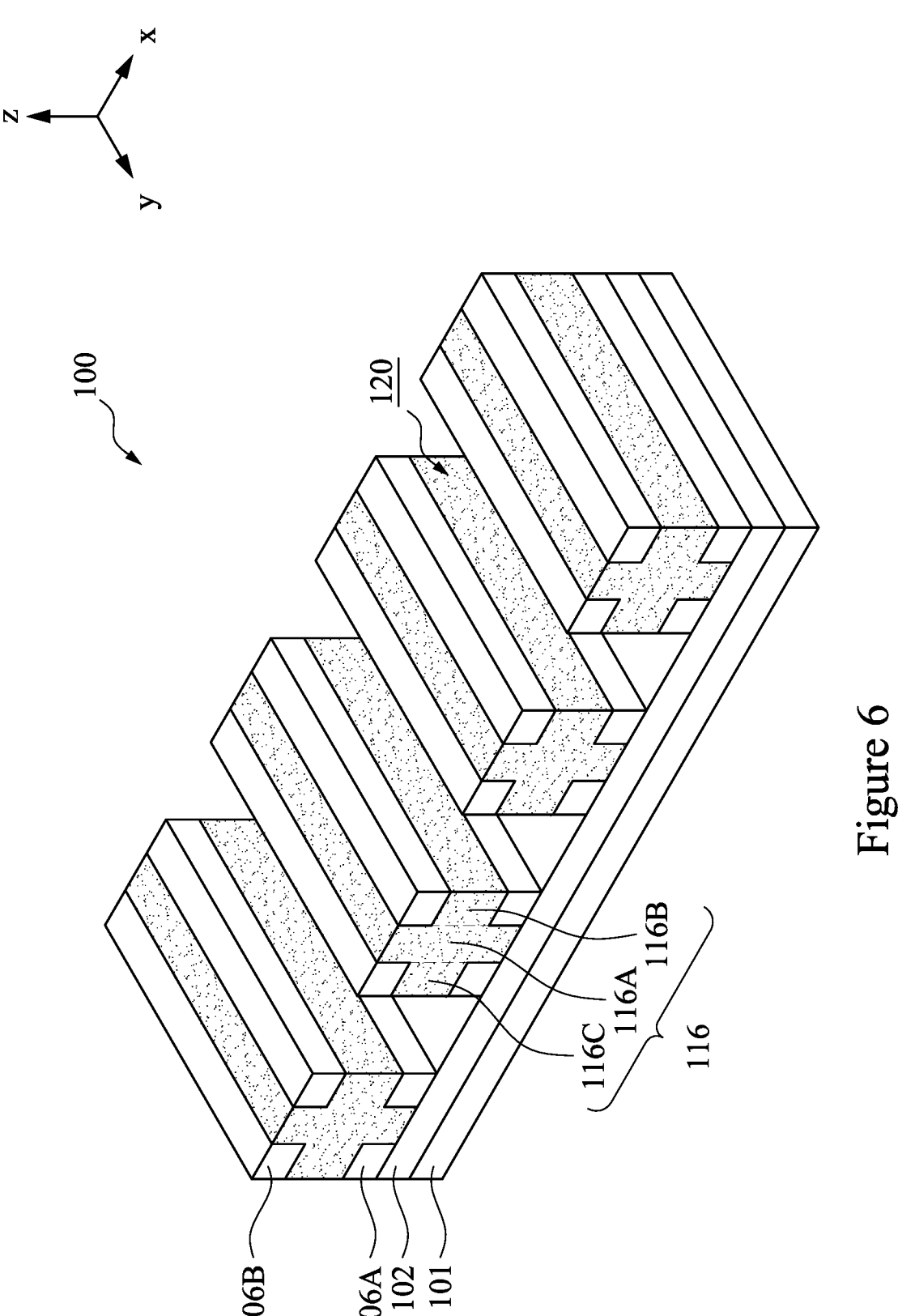

In FIG. 6, portions of the multi-layer stack 104 aligned to the sidewalls of first gate electrodes 116 (or aligned to the remaining portions of the third dielectric layer 108) are removed, thereby forming trenches 120 between adjacent first gate electrodes 116, in accordance with some embodiments. Removing the portions of the multi-layer stack 104 may be performed by forming a mask that is patterned to have a pattern exposing regions corresponding to the remaining portions of the third dielectric layer 108. The mask may be formed of a photoresist, such as a single layer photoresist, a tri-layer photoresist, or the like, or a hard mask, such as TiN or other suitable mask materials other than the materials of the first to third dielectric layers 106A, 106B, and 108. The etching includes etching the exposed regions of the multi-layer stack 104 using a dry etch or a wet etch. For example, the dry etch may be a reactive ion etch (RIE), neutral beam etch (NBE), the like, or a combination thereof. The etching may be anisotropic. As a result, the third dielectric layer 108 is completely or substantially removed. The mask may be removed during or after the formation of the trenches 120.

The trenches 120 may extend in the y-direction, leaving the first dielectric layer 106A as dielectric lines disposed below the second portion 116B and the third portion 116C of the first gate electrodes 116, and the second dielectric layer 106B as dielectric lines disposed over the second portion 116B and the third portion 116C of the first gate electrodes 116. In some embodiments, in a cross-sectional view in the x-direction (e.g., FIG. 11B), the first gate electrodes 116, the first dielectric layer 106A, and the second dielectric layer 106B may form a rectangular or a rectangular-like shape. The first and second dielectric layers 106A and 106B are disposed at the four corners of the rectangular shape for sandwiching the first gate electrodes 116.

Figure 7:
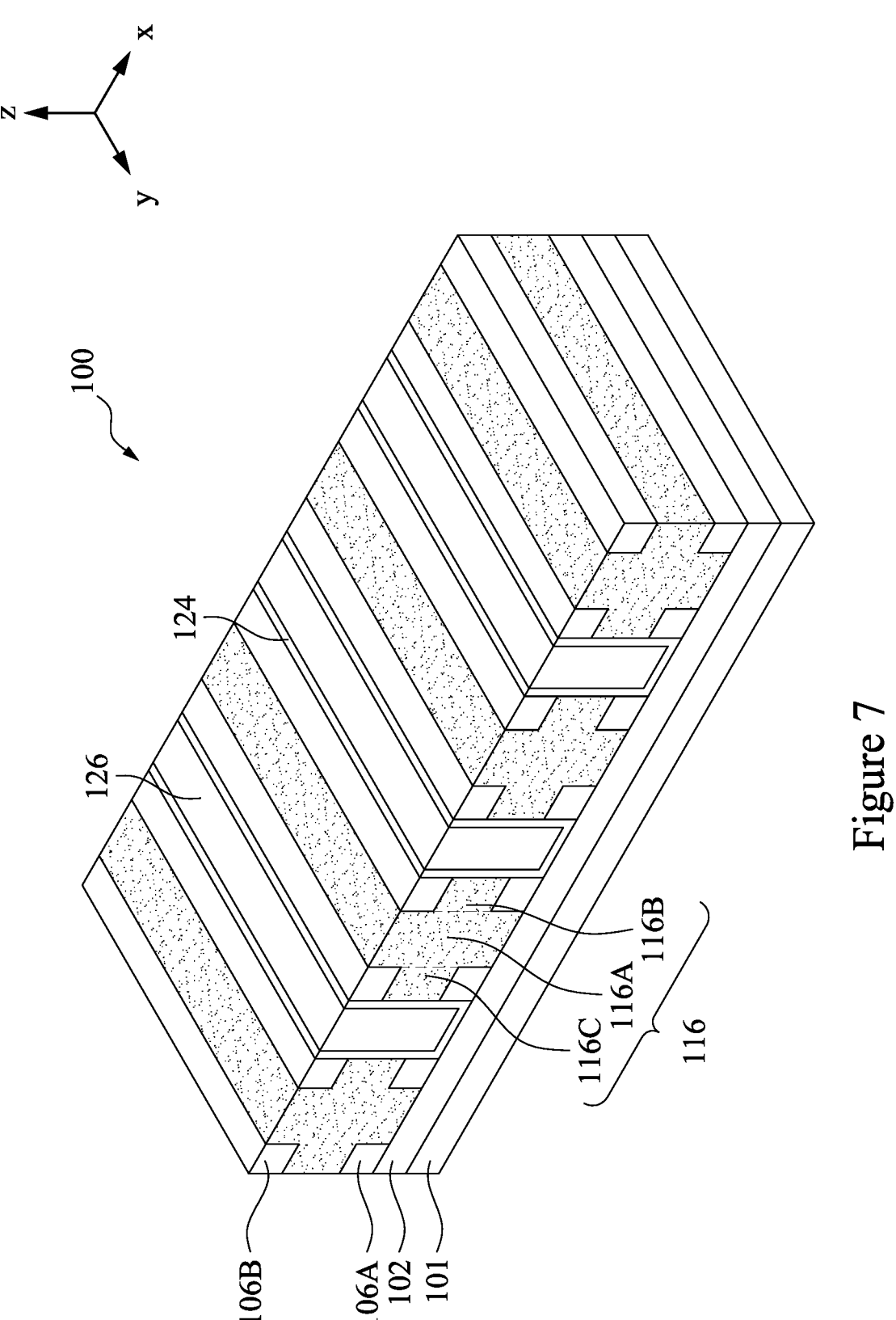

In FIG. 7, the first gate dielectric 124 and isolation regions 126 are formed in the trenches 120, in accordance with some embodiments. For example, the first gate dielectric 124 may be conformally formed over the substrate 101 (or the interconnect structure 102) and sidewalls of the first gate electrodes 116 and the first and second dielectric layers 106A and 106B. The isolation regions 126 may be formed for filling the remaining portions of the trenches 120. Excess materials of the first gate dielectric 124 and the isolation regions 126, such as materials over the top surfaces of the second dielectric layer 106B and the first gate electrodes 116, may be removed by CMP, etch-back process, or other suitable planarizing processes. In some embodiments, the first gate dielectric 124 is formed of a high-k dielectric material, such as a metal oxide or a silicate of hafnium, aluminum, zirconium, lanthanum, manganese, barium, titanium, lead, or combinations thereof. In some embodiments, the first gate dielectric 124 is formed of a memory film, such as a ferroelectric film, such as hafnium oxide, hafnium zirconium oxide, silicon-doped hafnium oxide, or the like. In some embodiments, the first gate dielectric 124 has a thickness of 0.1 nm to 50 nm. The material of the first gate dielectric 124 may be formed by any acceptable deposition process such as ALD, CVD, or the like. Acceptable dielectric materials for the isolation regions 126 include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other acceptable dielectric materials may be utilized. The material of the isolation regions 126 may be formed by any acceptable deposition process such as CVD (e.g., flowable CVD (FCVD)), PVD, suitable coating techniques, or the like.

Figure 8:
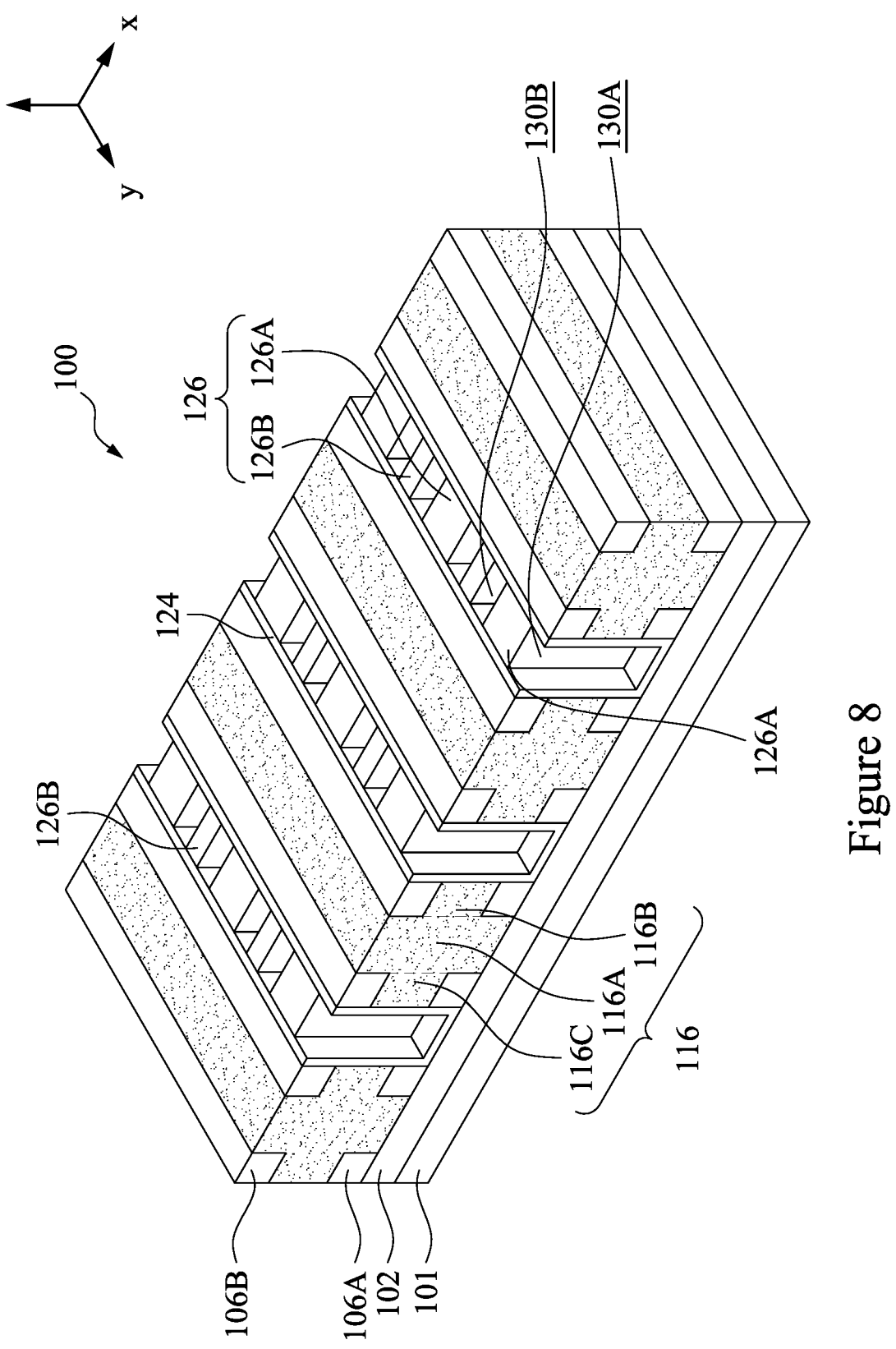

In FIG. 8, portions of the isolation regions 126 are removed to form openings 130A and openings 130B, leaving isolation regions 126A and isolation regions 126B sandwiched by the openings 130A and 130B, in accordance with some embodiments. In some embodiments, a thickness of isolation regions 126A in the y-direction is greater or equal to a thickness of the isolation regions 126B in the y-direction. The openings 130A and 130B may be formed by an isotropic etch, such as RIE or NBE, using an etchant, such as dry etch using $Cl_2$, $CF_4$, $CH_3F$, $CH_2F_2$, the like, or a combination thereof. A pair of one respective opening 130A and one respective opening 130B may provide a pair of openings for forming a pair of source/drain electrodes of one respective transistor 50A of one respective memory cell 50. Adjacent memory cells 50 may be separated by one respective isolation region 126B. In subsequent processes, the isolation regions 126A will be replaced with the semiconductor films 140 and the second gate structures 142.

Figure 9:
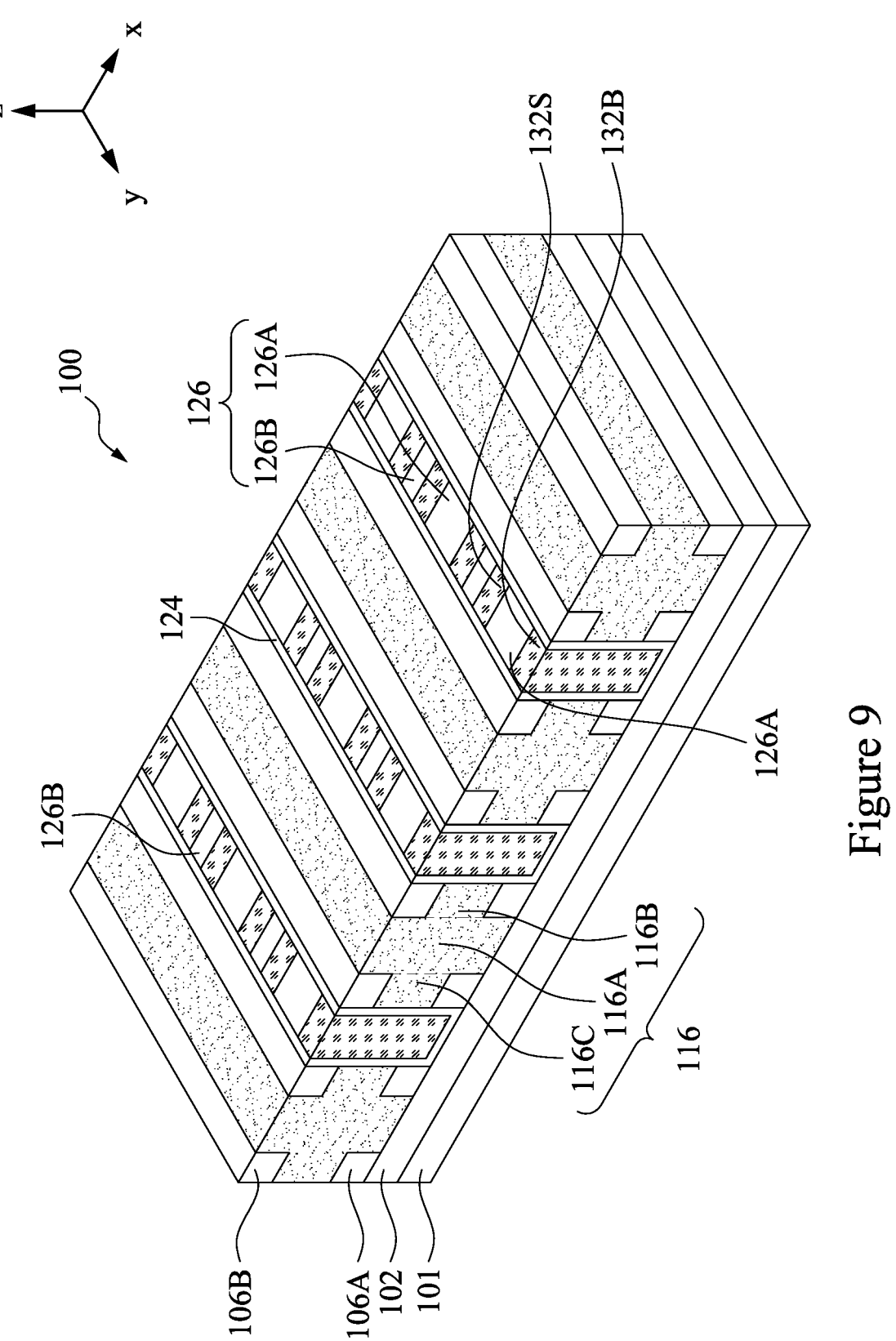

In FIG. 9, a conductive material is deposited in the openings 130A and 130B for forming the first source/drain electrodes 132B and the second source/drain electrodes 132S in the openings 130A and the openings 130B, respectively, in accordance with some embodiments. The first source/drain electrodes 132B and the second source/drain electrodes 132S may each include one or more liner layers and a main layer. The liner layers may be one or more seed layers, adhesion layers, diffusion barrier layers, and the like. The main layer may be formed over the liner layer and have a low resistivity. The main layer may have a thickness greater than the thickness of the liner layer. In some embodiments, the first source/drain electrode 132B and the second source/drain electrode 132S may include a similar material to the first gate electrodes 116. For example, the liner layer may be a metal nitride, such as titanium nitride, tantalum nitride, molybdenum nitride, zirconium nitride, hafnium nitride, or the like. The main layer may be a metal, such as tungsten, ruthenium, molybdenum, cobalt, aluminum, nickel, copper, silver, gold, alloys thereof, or the like. In some embodiments, the liner layer is formed of titanium nitride, and the main layer is formed of tungsten. The materials of the liner layer and the main layer may be formed by acceptable deposition processes such as CVD, ALD, PVD, or the like. In some embodiments, excess materials of the first source/drain electrodes 132B and the second source/drain electrodes 132S, such as materials over the top surfaces of the isolation regions 126A and 126B, the second dielectric layer 106B, and the first gate electrodes 116, may be removed by a planarizing process, such as CMP, an etch-back process, combinations thereof, or the like. It should be appreciated that although FIG. 9 illustrates a particular placement of the first source/drain electrodes 132B and the second source/drain electrodes 132S, the placement of the first source/drain electrodes 132B and the second source/drain electrodes 132S may be flipped in some embodiments.

Figure 10:
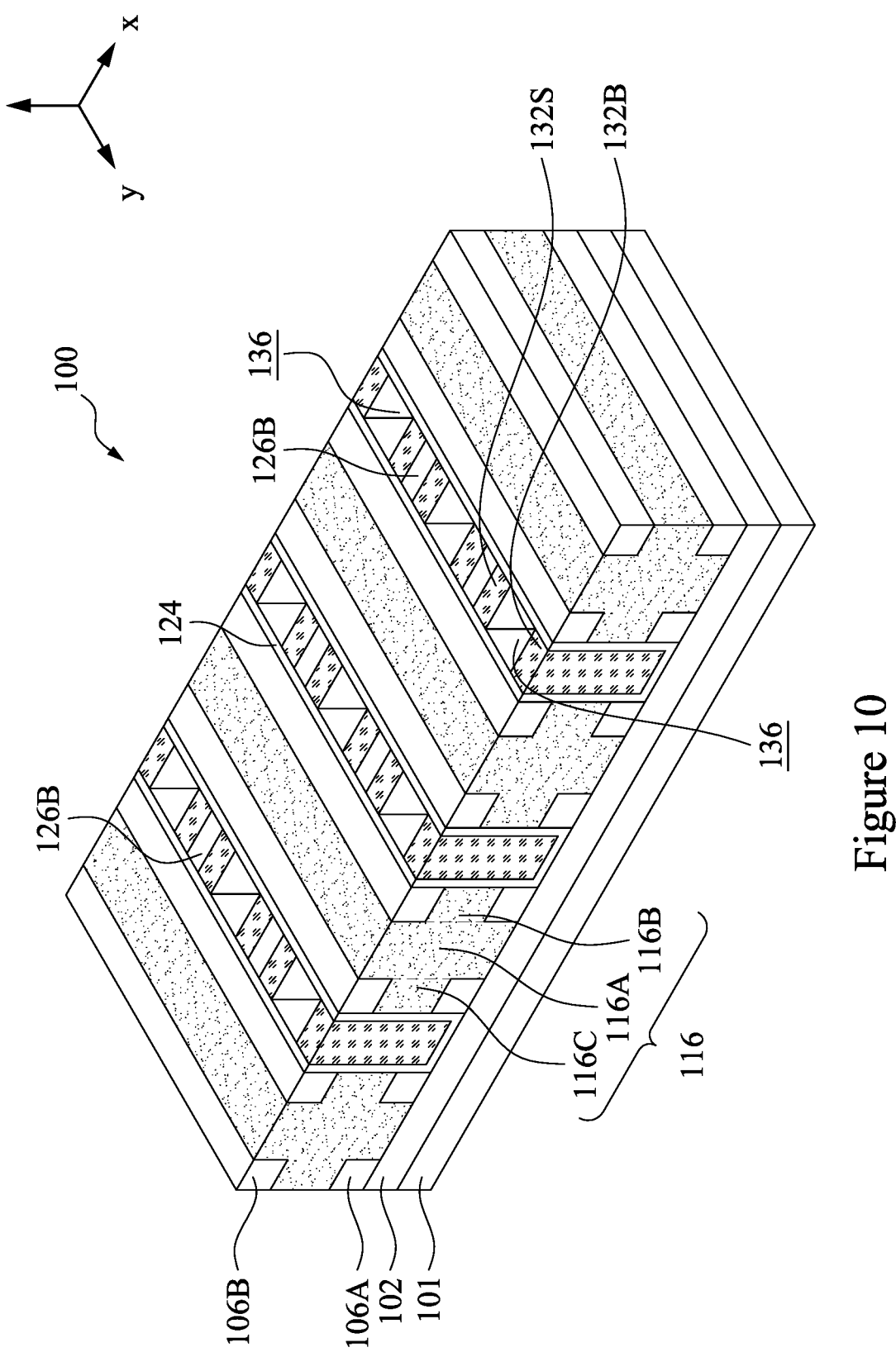

In FIG. 10, the isolation regions 126A are removed to form openings 136, in accordance with some embodiments. The openings 136 may be formed by an acceptable etching. For example, a patterned mask (not shown) is formed with exposing the isolation regions 126A while covering other features of the memory array 100. The patterned mask may be formed of a photoresist, such as a single layer photoresist, a tri-layer photoresist, or the like, or a hard mask, such as TiN or other suitable mask materials other than the materials of isolation regions 126A. The removal of the isolation regions 126A also includes etching the isolation regions 126A using a dry etch or a wet etch. For example, the isolation regions 126A may be etched by a dry etch using $Cl_2$, $CF_4$, $CH_3F$, $CH_2F_2$, or the like. In some embodiments, the etching is anisotropic. Alternatively, the etching may be isotropic in some embodiments that the isolation regions 126A have a high etching selectivity with the first and second dielectric layers 106A and 106B.

Figure 11A:
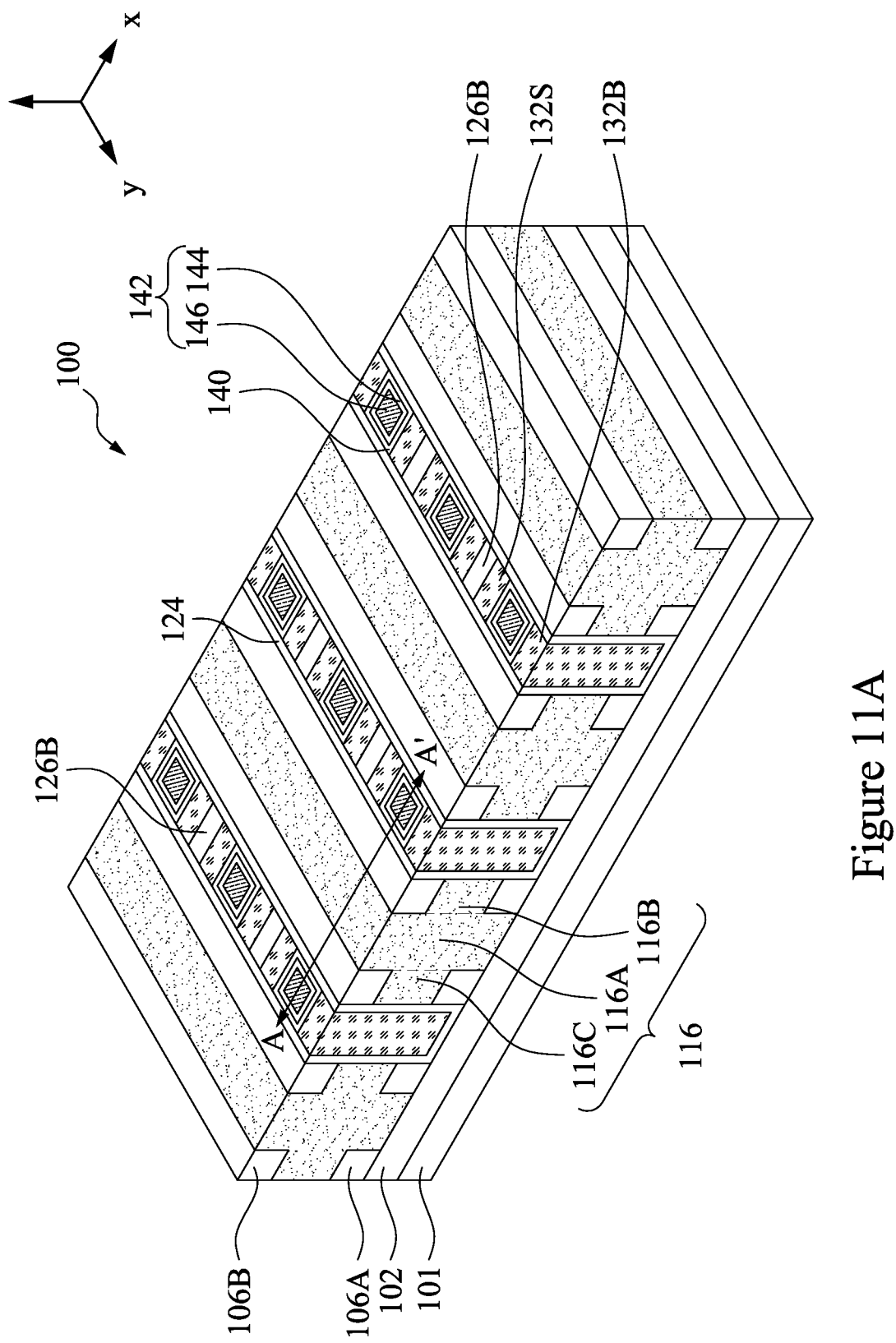
Figure 11B:
FIG. 11B is a cross-sectional view of intermediate stages in the manufacturing of a memory array, in accordance with some embodiments.

In FIGS. 11A and 11B, the semiconductor films 140 and the second gate structures 142 are formed in the openings 136, in accordance with some embodiments. FIG. 11A illustrates a three-dimensional view of the memory array 100. FIG. 11B illustrates a cross-sectional view of FIG. 11A along the section A-A' in the x-direction. The semiconductor films 140 may be formed (e.g., conformally) in the openings 136, such as being deposited over bottom portions and sidewalls of the first gate dielectric 124. The semiconductor films 140 may be formed of semiconductor material suitable for providing a channel region for a FET. In some embodiments, the semiconductor films 140 are formed of an oxide semiconductor, such as an indium-based semiconductor material, such as indium gallium zinc oxide (IGZO), indium tin oxide (ITO), indium gallium zinc tin oxide (IGZTO), zinc oxide (ZnO), or the like. In some embodiments, the semiconductor films 140 are formed of a silicon-based semiconductor material, such as polysilicon, amorphous silicon, or the like. Other acceptable semiconductor materials may be utilized. The material of the semiconductor films 140 may be formed by any acceptable deposition process such as ALD, CVD, PVD, or the like. In some embodiments, the semiconductor films 140 are formed to a thickness in the range of 3 nm to 20 nm.

Next, the second gate structures 142 are formed over the semiconductor films 140, in accordance with some embodiments. For example, the second gate dielectric 144 may be formed (e.g., conformally) over bottom portions and sidewalls of the semiconductor films 140, and the second gate electrodes 146 may be formed over the second gate dielectric 144 and fill the remaining portions of the openings 136. In some embodiments, the second gate dielectric 144 is formed of a high-k dielectric material, such as a metal oxide or a silicate of hafnium, aluminum, zirconium, lanthanum, manganese, barium, titanium, lead, or combinations thereof. In some embodiments, the second gate dielectric 144 is formed of a memory film, such as a ferroelectric film, which may be hafnium oxide, hafnium zirconium oxide, silicon-doped hafnium oxide, or the like. However, at least one of the first gate dielectric 124 or the second gate dielectric 144 is formed of the memory film. In some embodiments, the second gate dielectric 144 has a thickness of 0.1 nm to 50 nm. The second gate dielectric 144 may be formed by any acceptable deposition process such as ALD or CVD.

The second gate electrodes 146 may include a material similar to the first gate electrodes 116. The second gate electrodes 146 may also be formed of a material similar to the first source/drain electrodes 132B and the second source/drain electrodes 132S. For example, the second gate electrodes 146 may include a liner layer of TiN and a main layer of tungsten. Alternatively, a material different from the first gate electrodes 116 is used. In some embodiments, the material selection for the second gate electrodes 146 may be more flexible than the first gate electrodes 116. The first gate electrodes 116 may have a long length (e.g., longer than the second gate electrodes 146), and using the material having a low resistivity (e.g., tungsten) may reduce the resistance of the first gate electrodes 116 and help increase the performance of the memory array 100. Thus, the work function of the transistors 50A may be tuned by selecting different materials for the second gate electrodes 146, such as for increasing the threshold voltage of the transistors and reducing the leakage current, instead of changing the material of the first gate electrodes 116. In some embodiments, the second gate electrodes 146 include Mo, Ti, Pd, Co, Cr, Cu, Ni, Ta, Pt, Au, Al, TiW, TaN, WN, WCN, the like, or combinations thereof.

Excess materials of the second gate dielectric 144 and the second gate electrodes 146, such as materials over the top surfaces of the semiconductor films 140, the second dielectric layer 106B, and the first gate electrodes 116, may be removed by CMP, etch-back process, or other suitable planarizing processes. After the removal, the top surfaces of the semiconductor films 140, the second gate dielectric 144, and the second gate electrodes 146, the second dielectric layer 106B, the first gate dielectric 124, and the first gate electrode 116 are coplanar (within process variations) such that they are level with one another. The semiconductor films 140 and the second gate dielectric 144 may each have a ring shape or the like in the planar view. Also, the semiconductor films 140 and the second gate dielectric 144 may each have a U-shape or the like in the cross-sectional view in the x-direction. The second gate electrodes 146 may each include a square shape, a rounded square shape, a rectangular shape, a rounded rectangular shape, a circular shape, an oval shape, or the like in the planar view, and at least laterally surrounded by the second gate dielectric 144 and the semiconductor films 140.

Figure 12:
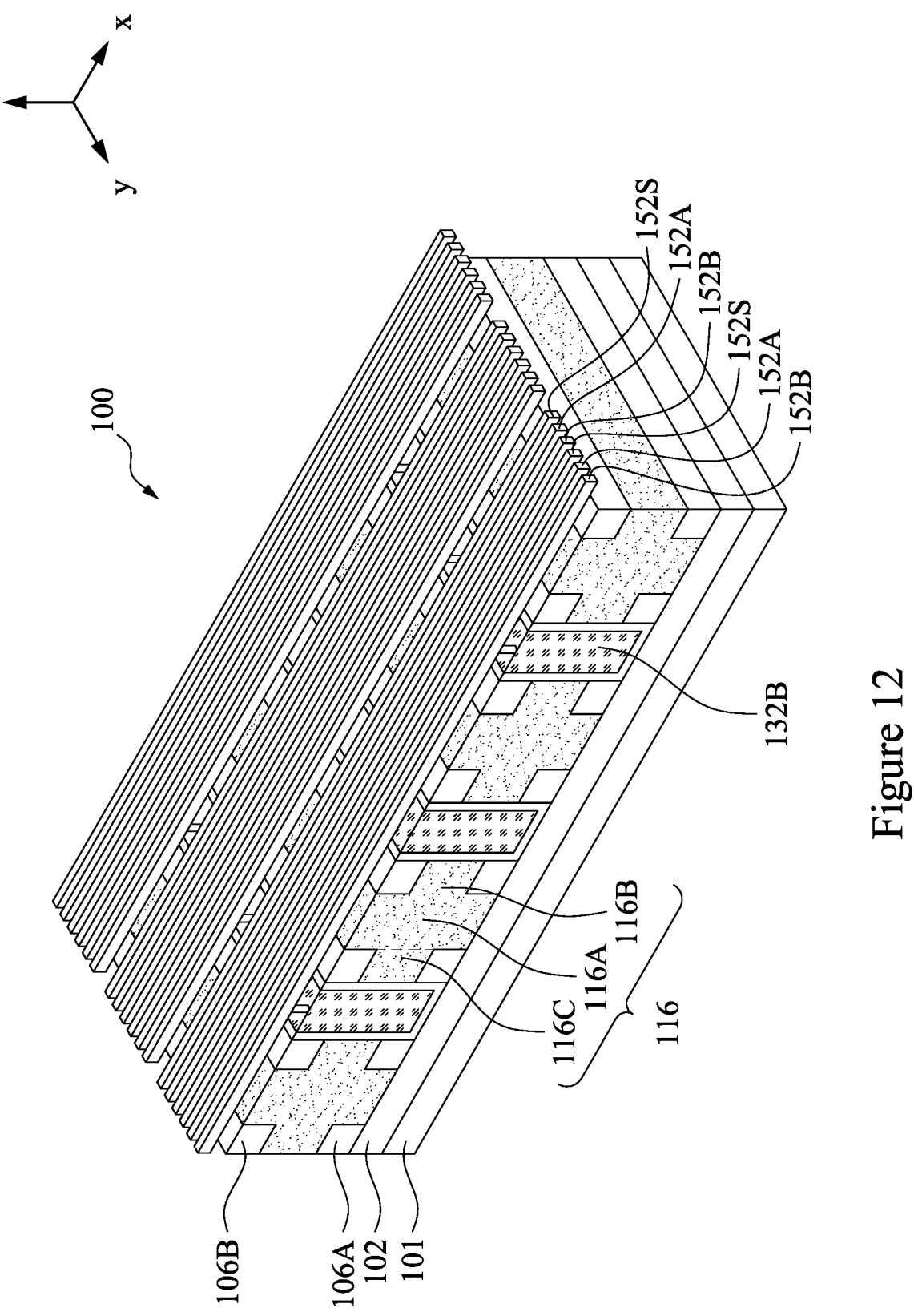

In FIG. 12, bit lines 152B, source lines 152S, and conductive lines 152A are formed over the intermediate structure as illustrated in FIG. 11A. The bit lines 152B, the source lines 152S, and the conductive lines 152A are electrically coupled to the first source/drain electrodes 132B, the second source/drain electrodes 132S, and the second gate electrodes 146, respectively, in accordance with some embodiments. In some embodiments, the bit lines 152B, the source lines 152S, and the conductive lines 152A are formed in a same layer, such as in a same dielectric layer (not shown). In some embodiments, the bit lines 152B, the source lines 152S, and the conductive lines 152A may be formed in a plurality of dielectric layers (not shown). Conductive lines connected to the first gate electrodes 116 may also be formed in a same layer(s) as the bit lines 152B, the source lines 152S, and the conductive lines 152A, although they are not independently shown in FIG. 12. In some embodiments, the conductive lines connected to the first gate electrodes 116 may connect to the top of the first gate electrodes 116 and provide appropriate voltages from the top of first gate electrodes 116, and at least one of the conductive lines may connect to the bottom of the first gate electrodes 116 and provide appropriate voltages to the first gate electrodes 116 from the bottom of the first gate electrodes 116, such as from the interconnect structure 102.

In embodiments where the first gate dielectric 124 or the second gate dielectric 144 is the memory film of a ferroelectric material, the memory film may be polarized in one of two different directions, and the polarization direction may be changed by applying an appropriate voltage differential across the memory film and generating an appropriate electric field. The polarization may be relatively localized (e.g., generally contained within each of the boundaries of the memory cells 50), and a continuous region of the memory film may extend across a plurality of memory cells 50. Depending on a polarization direction of a particular region of the memory film, a threshold voltage of a corresponding transistor 50A varies, and a digital value (e.g., 0 or 1) can be stored. For example, when a region of the memory film has a first electrical polarization direction, the corresponding transistor 50A may have a relatively low threshold voltage, and when the region of the memory film has a second electrical polarization direction, the corresponding transistor 50A may have a relatively high threshold voltage. The difference between the two threshold voltages may be referred to as the threshold voltage shift. A larger threshold voltage shift makes it easier (e.g., less error prone) to read the digital value stored in the corresponding memory cell 50.

To perform a write operation on a memory cell 50 in such embodiments, a write voltage is applied across a portion of the memory film corresponding to the memory cell 50. The write voltage can be applied, for example, by applying appropriate voltages to a corresponding first gate electrode 116, a corresponding second gate electrode 146, a corresponding first source/drain electrode 132B, and a corresponding second source/drain electrode 132S. By applying the write voltage across the portion of the memory film, a polarization direction of the region of the memory film can be changed. As a result, the corresponding threshold voltage of the corresponding transistor 50A can also be switched from a low threshold voltage to a high threshold voltage or vice versa, and a digital value can be stored in the memory cell 50. Because first gate electrode 116 and the second gate electrode 146 intersect the first source/drain electrode 132B (e.g., a part of bit line) and the second source/drain electrode 132S (e.g., a part of source lines), individual memory cells 50 may be selected for the write operation.

To perform a read operation on the memory cell 50 in such embodiments, a read voltage (e.g., the voltage difference of the first gate electrode 116 and the second gate electrode 146, between the low and high threshold voltages) is applied to the corresponding first gate electrode 116 and the second gate electrode 146. Depending on the polarization direction of the corresponding region of the memory film, the transistor 50A of the memory cell 50 may or may not be turned on. As a result, the bit line 152B may or may not be discharged through the source line 152S (e.g., to ground), and the digital value stored in the memory cell 50 can be determined. Because first gate electrode 116 and the second gate electrode 146 intersect the first source/drain electrode 132B (e.g., a part of bit lines) and the second source/drain electrode 132S (e.g., a part of source lines), individual memory cells 50 may be selected for the read operation. In some embodiments, as illustrated in FIG. 11B, each of the first gate electrodes 116 (e.g., a part of the word lines) may connect to two of the first gate dielectric 124 (left and right of the first gate electrode 116), and the digital value of these two of the first gate dielectric 124 may be independently read by providing appropriate voltages to the corresponding second gate electrodes 146. For example, different voltages may be provided to the second gate electrodes 146 on different sides of the first gate electrodes 116 and make sure one of the transistors 50A is turned off when reading the digital value stored in the first gate dielectric 124 of the other transistor 50A.

One or more interconnect layer(s) (not shown) are formed over the intermediate structure as illustrated in FIG. 12. The interconnect layer(s) each include interconnects in a dielectric layer. The interconnects are electrically coupled to the first gate electrodes 116, the bit lines 152B, the source lines 152S, the conductive lines 152A, and the interconnect structure 102 to interconnect the transistors 50A to form functional memories. The interconnect layer(s) may be formed by a damascene process, such as a single damascene process, a dual damascene process, or the like.

FIGS. 13A-13D illustrate cross-sectional views of the memory array 100 along the section A-A' as illustrated in FIG. 11A, with alternative first gate electrode configurations in accordance with some embodiments. For example, when performing the processes for forming the sidewall recesses 112 by laterally etching the third dielectric layer 108, as described in reference to FIG. 4, the sidewalls of the remaining portions of the third dielectric layer 108 may not be vertical, such as being inclined. As a result, the sidewalls of the subsequently-filled first gate electrodes 116 may have a shape reversely corresponding to the sidewalls of the remaining portions of the third dielectric layer 108. In some embodiments that the anisotropic etch is used for forming the openings 136 as described for reference to FIG. 10, the anisotropic etch may be performed by aligning the outermost point of the first gate electrodes 116, thereby leaving portions of the third dielectric layer 108 on the sidewalls of the first gate electrodes 116 as dielectric spacers 108S. In the resulting structures, the dielectric spacers 108S may be disposed between the first gate electrodes 116 and the first gate dielectric 124, as illustrated in FIGS. 13A-13D.

Figure 13A:
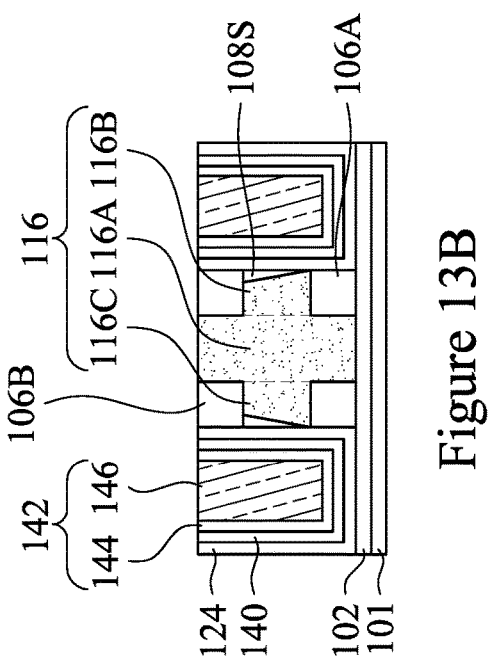
FIGS. 13A-15C are cross-sectional views of intermediate stages in the manufacturing of a memory array, in accordance with alternative embodiments.
Figure 13B:
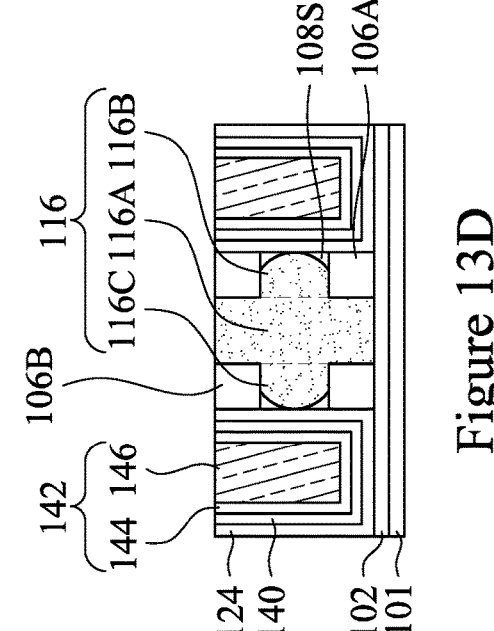
Figure 13C:
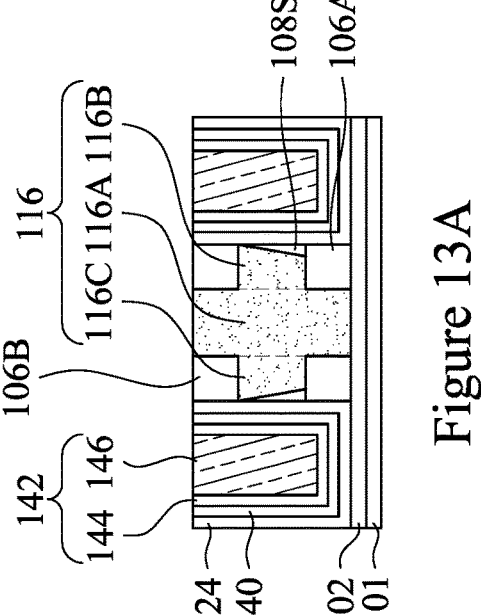
Figure 13D:
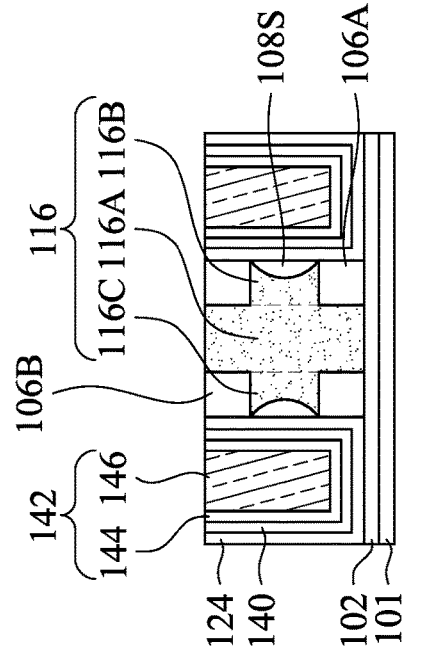

The shapes of the dielectric spacers 108S may be controlled by the etchant and other etching process parameters, such as temperature and time of the lateral etching process as described in reference to FIG. 4. For example, the dielectric spacers 108S may have a triangle or triangle-like shape, having a wide bottom as illustrated in FIG. 13A, or with a wide top as illustrated in FIG. 13B. In some embodiments in which the dielectric spacers 108S have the wide bottom, the electric field provided by the first gate electrode 116 may be localized near the top of the second portion 116B (and the third portion 116C) of the first gate electrodes 116. As such, the speed of the first gate electrode 116 of FIG. 13A generating the electric field across the first gate dielectric 124 may be increased when the voltage is transmitted from an interconnect connected to the top of the first gate electrode 116. Alternatively, in some embodiments in which the dielectric spacers 108S have a wide top, the electric field provided by the first gate electrode 116 may be localized near the bottom of the second portion 116B (and the third portion 116C) of the first gate electrode 116. As such, the speed of the first gate electrode 116 of FIG. 13B for generating the electric field across the first gate dielectric 124 may be increased when the voltage is transmitted from an interconnect (e.g., interconnect structure 102) connected to the bottom of the first gate electrode 116. FIG. 13C and FIG. 13D provide different configurations of the first gate electrodes 116 and the dielectric spacers 108S for generating the localized electric fields at different positions. The configurations of the first gate electrodes 116 and the dielectric spacers 108S of FIGS. 13C and 13D may be formed by adjusting the etching processes for forming the sidewall recesses 112 by laterally etching the third dielectric layer 108, as described in reference to FIG. 4.

Figure 14B:
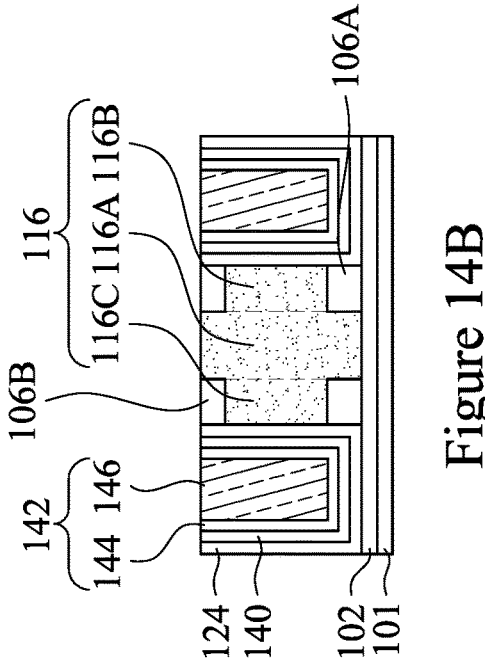
Figure 14A:
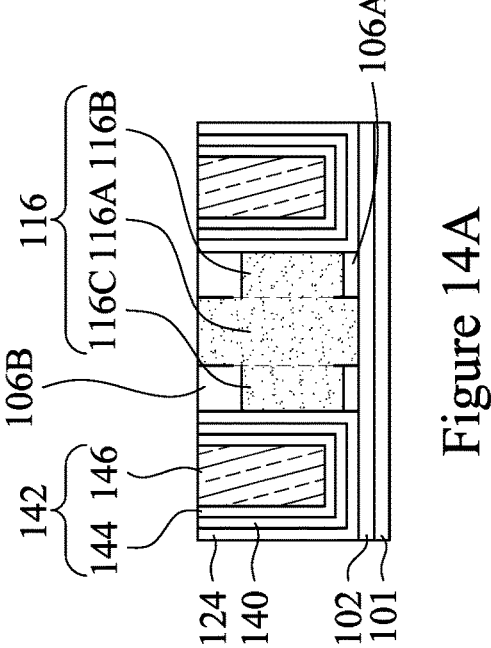

FIGS. 14A and 14B illustrate cross-sectional views of the memory array 100 along the section A-A' as illustrated in FIG. 11A, with alternative first gate electrode configurations in accordance with some embodiments. The first dielectric layer 106A and the second dielectric layer 106B have different thicknesses. For example, in FIG. 14A, the second dielectric layer 106B may have a thickness greater than that of the first dielectric layer 106A, and thus the second portion 116B and the third portion 116C of the first gate electrode 116 are closer to the bottom of the first gate electrode 116 than the top of the first gate electrode 116. As such, the electric field provided by the first gate electrode 116 may be localized at a place closer to the bottom of the first gate electrode 116 than the top of the first gate electrode 116. In some embodiments, the speed of the first gate electrode 116 of FIG. 14A for generating the electric field across the first gate dielectric 124 may be increased when the voltage is transmitted from an interconnect connected to the bottom of the first gate electrode 116. In FIG. 14B, the second dielectric layer 106B may be thinner than the first dielectric layer 106A, and thus the second portion 116B and the third portion 116C of the first gate electrode 116 are closer to the top of the first gate electrode 116 than the bottom of the first gate electrode 116. As such, the electric field provided by the first gate electrode 116 may be localized at a place closer to the top of the first gate electrode 116 than the bottom of the first gate electrode 116. In some embodiments, the speed of the first gate electrode 116 of FIG. 14B for generating the electric field across the first gate dielectric 124 may be increased when the voltage is transmitted from an interconnect connected to the top of the first gate electrode 116.

Figure 15A:
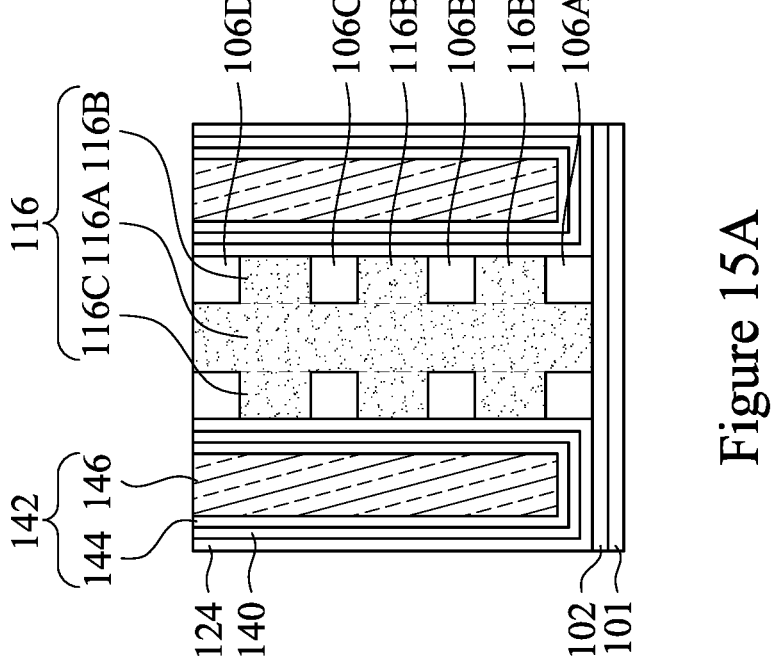
Figure 15C:
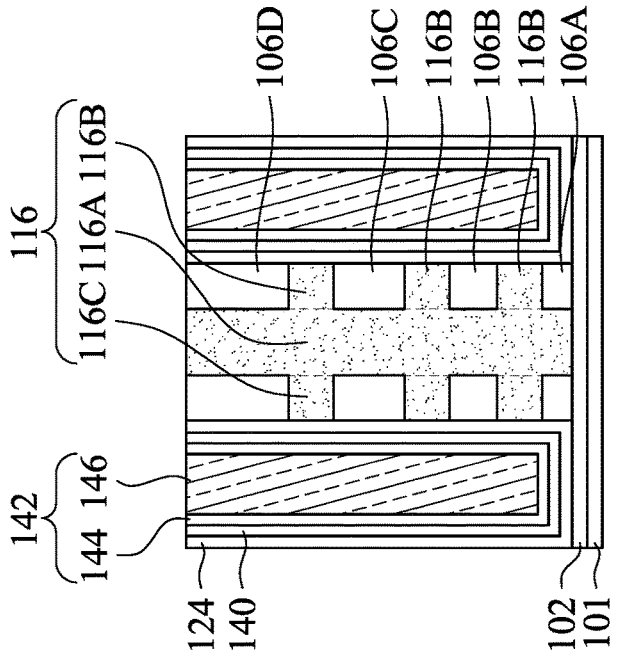
Figure 15B:
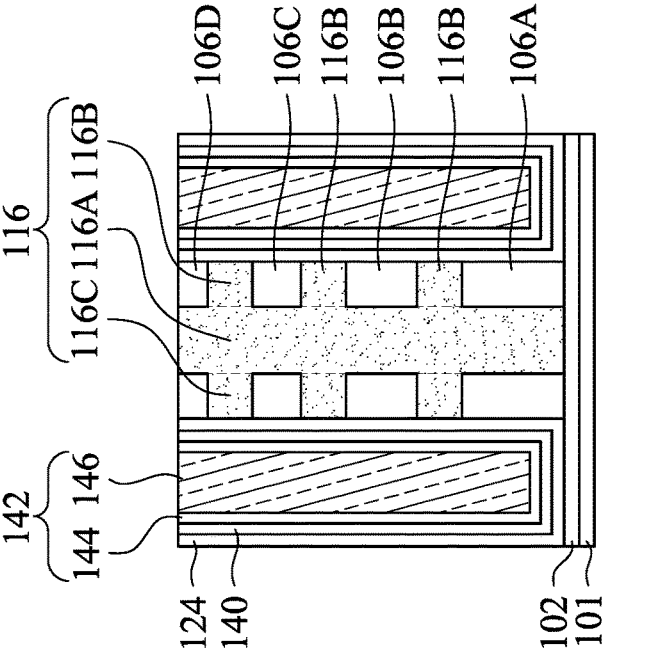

FIGS. 15A to 15C illustrate cross-sectional views of the memory array 100 along the section A-A' as illustrated in FIG. 11A, with alternative first gate electrode configurations in accordance with some embodiments. In some embodiments, the multi-layer stack 104 has more than three dielectric layers, such as including seven dielectric layers. The dielectric layers 106A-106D formed of the first dielectric materials and the dielectric layers 108A-108C formed of the second dielectric material are alternatively stacked, as illustrated in FIGS. 15A-15C, in accordance with some embodiments. As a result, the first gate electrodes 116 may thus have a plurality of second portions 116B and a plurality of third portions 116C sandwiched by the dielectric layers 106A-106D.

In some embodiments, as illustrated in FIG. 15A, each of the dielectric layers 106A to 106D has a substantially same thickness. The electrical field generated by the first gate electrodes 116 may be uniformly distributed in the thickness direction (e.g., the z-direction). In some embodiments, the dielectric layers 106A to 106D may have different thicknesses. For example, as illustrated in FIG. 15B, the thicknesses of the dielectric layers 106A to 106D may be gradually decreased from bottom to top, and therefore the second portions 116B and third portions 116C of the first gate electrode 116 in overall are closer to the top of the first gate electrodes 116 than the bottom of the first gate electrode 116. In some embodiments, the speed of the first gate electrode 116 of FIG. 15B for generating the electric field across the first gate dielectric 124 may be increased when the voltage is transmitted from an interconnect connected to the top of the first gate electrode 116. Alternatively, as illustrated in FIG. 15C, the thicknesses of the dielectric layers 106A to 106D may be gradually increased from bottom to top, and therefore the second portions 116B and third portions 116C of the first gate electrode 116 in overall are closer to the bottom of the first gate electrodes 116 than the top of the first gate electrode 116. In some embodiments, the speed of the first gate electrode 116 of FIG. 15C for generating the electric field across the first gate dielectric 124 may be increased when the voltage is transmitted from an interconnect (e.g., the interconnect structure 102) connected to the bottom of the first gate electrode 116.

Embodiments may achieve advantages. Vertical FETs (e.g., transistors 50A) for a memory array are provided in accordance with some embodiments. The vertical FETs may provide an increased channel width for enhancing the performance of the vertical FETs without increasing the footprint of the memory array. The vertical FETs may also provide more options for tuning the places for the first gate electrode 116 (e.g., word lines) for generating a localized electric field across the first gate dielectric 124 (e.g., memory film). Including the second gate structure 142 may increase the threshold voltage (Vt) of the transistors 50A and provide more options for providing voltage differential across the memory film of the memory cells 50. The material of the second gate electrode 146 may be selected to tune the work function, instead of changing the material of the first gate electrode 116. The work functions of the transistors 50A may be tuned while not significantly affecting the performance of the memory array.

In an embodiment, a device includes a first gate structure over a substrate, the first gate structure including a first gate electrode over a first side of a first gate dielectric; a first electrode disposed over a second side of the first gate dielectric opposite the first side; a second electrode disposed over the second side of the first gate dielectric; a second gate structure disposed between the first electrode and the second electrode, the second gate structure including a second gate electrode and a second gate dielectric, the second gate dielectric at least laterally surrounding the second gate electrode; and a semiconductor film disposed between the first electrode and the second electrode and at least laterally surrounding the second gate structure, wherein at least one of the first gate dielectric or the second gate dielectric is a memory film. In an embodiment, the first gate electrode includes a first portion between a second portion and a third portion, wherein the first portion has a thickness different than the second portion and the third portion. In an embodiment, the device includes a first dielectric layer disposed below the second portion of the first gate electrode and between the first portion of the first gate electrode and the first gate dielectric. In an embodiment, the device includes a second dielectric layer disposed over the second portion of the first gate electrode and between the first portion of the first gate electrode and the first gate dielectric. In an embodiment, the second gate dielectric extends below the second gate electrode. In an embodiment, the semiconductor film extends below the second gate structure. In an embodiment, the first gate electrode and the second gate electrode are formed of different materials. In an embodiment, the first electrode is electrically coupled to a bit line, and the second electrode is electrically coupled to a source line. In an embodiment, the memory film is a ferroelectric film. In an embodiment, the device includes a dielectric spacer disposed between the first gate electrode and the first gate dielectric.

In an embodiment, a device includes a first gate dielectric extending in a first direction; a word line disposed over a first side of the first gate dielectric in a second direction and extending in the first direction, the second direction being perpendicular to the first direction; a first electrode disposed over a second side of the first gate dielectric opposite the word line in the second direction, the first electrode being part of or electrically coupled to a first bit line; a second electrode disposed over the second side of the first gate dielectric, the second electrode being part of or electrically coupled to a first source line; a semiconductor film disposed between the first electrode and the second electrode; and a first gate structure disposed over a portion of the semiconductor film in the first direction such that the portion of the semiconductor film is sandwiched by the first gate dielectric and the first gate structure, wherein top surfaces of the word line and the first gate structure are level with each other. In an embodiment, the device further includes a third electrode, a fourth electrode, and a second gate structure disposed over a side of the second electrode opposite the first gate structure in the first direction, the third electrode being part of or electrically coupled to a second bit line, the fourth electrode being part of or electrically coupled to a second source line. In an embodiment, the word line includes a first portion sandwiched between a second portion and a third portion, each of the first portion, the second portion, and the third portion extending along the first gate dielectric in the first direction, the first portion having a thickness different than the second portion and the third portion. In an embodiment, the device further includes a first dielectric layer disposed below the second portion of the word line and a second dielectric layer disposed over the second portion of the word line, each of the first dielectric layer and the second dielectric layer extending along the first portion of the word line in the first direction and intersecting the third electrode and the fourth electrode. In an embodiment, top surfaces of the second dielectric layer and the word line are level with each other.

In an embodiment, a method of forming a device is provided. The method includes forming a multi-layer stack over a substrate, the multi-layer stack including a first dielectric layer, a second dielectric layer, and a third dielectric layer sandwiched between the first dielectric layer and the second dielectric layer, the third dielectric layer having a material different from the first dielectric layer and the third dielectric layer; forming a first trench extending through the multi-layer stack; recessing a sidewall of the second dielectric layer from the first trench to form a sidewall recess between the first dielectric layer and the second dielectric layer; forming a conductive line in the first trench and the sidewall recess; removing a portion of the first dielectric layer, a portion of the second dielectric layer, and at least a portion of the third dielectric layer to form a second trench adjacent to the conductive line; forming a first gate dielectric in the second trench; and forming a first electrode, a second electrode, a semiconductor film, and a gate structure over the first gate dielectric and in the second trench, the semiconductor film and the gate structure disposed between the first electrode and the second electrode. In an embodiment, the method further includes forming an isolation region over the first gate dielectric and in the second trench before forming the first electrode and the second electrode, the semiconductor film, and the gate structure. In an embodiment, the method further includes performing a first removal for removing a first portion of the isolation region to form openings for forming the first electrode and the second electrode. In an embodiment, the method further includes performing a second removal for removing a second portion of the isolation region to form openings for forming the semiconductor film and the gate structure, wherein the first removal and the second removal are performed separately. In an embodiment, the third dielectric layer is completely removed when forming the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first gate structure over a substrate, the first gate structure comprising a first gate electrode over a first side of a first gate dielectric;
a first electrode disposed over a second side of the first gate dielectric opposite the first side;
a second electrode disposed over the second side of the first gate dielectric;
a second gate structure disposed between the first electrode and the second electrode, the second gate structure comprising a second gate electrode and a second gate dielectric, the second gate dielectric at least laterally surrounding the second gate electrode; and
a semiconductor film disposed between the first electrode and the second electrode and at least laterally surrounding the second gate structure,
wherein at least one of the first gate dielectric or the second gate dielectric is a memory film.

2. The device of claim 1, wherein the first gate electrode comprises a first portion between a second portion and a third portion, wherein the first portion has a thickness different than the second portion and the third portion.

3. The device of claim 2, further comprising a first dielectric layer disposed below the second portion of the first gate electrode and between the first portion of the first gate electrode and the first gate dielectric.

4. The device of claim 2, further comprising a second dielectric layer disposed over the second portion of the first gate electrode and between the first portion of the first gate electrode and the first gate dielectric.

5. The device of claim 1, wherein the second gate dielectric extends below the second gate electrode.

6. The device of claim 1, wherein the semiconductor film extends below the second gate structure.

7. The device of claim 1, wherein the first gate electrode and the second gate electrode are formed of different materials.

8. The device of claim 1, wherein the first electrode is electrically coupled to a bit line, and the second electrode is electrically coupled to a source line.

9. The device of claim 1, wherein the memory film is a ferroelectric film.

10. The device of claim 1, further comprising a dielectric spacer disposed between the first gate electrode and the first gate dielectric.

11. A device, comprising:
a first gate dielectric extending in a first direction;
a word line disposed over a first side of the first gate dielectric in a second direction and extending in the first direction, the second direction being perpendicular to the first direction;
a first electrode disposed over a second side of the first gate dielectric opposite the word line in the second direction, the first electrode being part of or electrically coupled to a first bit line;
a second electrode disposed over the second side of the first gate dielectric, the second electrode being part of or electrically coupled to a first source line;
a semiconductor film disposed between the first electrode and the second electrode; and
a first gate structure disposed over a portion of the semiconductor film in the first direction such that the portion of the semiconductor film is sandwiched by the first gate dielectric and the first gate structure, wherein top surfaces of the word line and the first gate structure are level with each other.

12. The device of claim 11, further comprising a third electrode, a fourth electrode, and a second gate structure disposed over a side of the second electrode opposite the first gate structure in the first direction, the third electrode being part of or electrically coupled to a second bit line, the fourth electrode being part of or electrically coupled to a second source line.

13. The device of claim 12, wherein the word line comprises a first portion sandwiched between a second portion and a third portion, each of the first portion, the second portion, and the third portion extending along the first gate dielectric in the first direction, the first portion having a thickness different than the second portion and the third portion.

14. The device of claim 13, further comprising a first dielectric layer disposed below the second portion of the word line and a second dielectric layer disposed over the second portion of the word line, each of the first dielectric layer and the second dielectric layer extending along the first portion of the word line in the first direction and intersecting the third electrode and the fourth electrode.

15. The device of claim 14, wherein top surfaces of the second dielectric layer and the word line are level with each other.

16. A device, comprising:
a first gate electrode extending in a vertical direction;
a first gate dielectric layer surrounding the first gate electrode in a plan view;

a semiconductor film surrounding the first gate dielectric layer in the plan view;
a first source/drain electrode on a first side of the first gate electrode and a second source/drain electrode on a second side of the first gate electrode in a first direction in the plan view;
a second gate dielectric layer extending along a first side of the first source/drain electrode and a first side of the second source/drain electrode in a second direction in the plan view, the first direction being perpendicular to the second direction; and
a second gate electrode extending along the second gate dielectric layer in a horizontal direction.

17. The device of claim 16, wherein the second gate dielectric layer extends along a bottom of the first source/drain electrode and a bottom of the second source/drain electrode.

18. The device of claim 17, wherein the semiconductor film extends between a bottom of the first gate dielectric layer and the second gate dielectric layer.

19. The device of claim 16, wherein the second gate electrode includes a first portion, a second portion, and a third portion, wherein the first portion extends vertically, wherein the second portion and the third portion extends horizontally from opposing sides of the first portion, wherein the second portion contacts the second gate dielectric layer.

20. The device of claim 16, further comprising an interconnect structure, wherein the first gate electrode and the second gate electrode are over the interconnect structure.

* * * * *